US007002859B2

(12) United States Patent
Finn et al.

(10) Patent No.: US 7,002,859 B2
(45) Date of Patent: Feb. 21, 2006

(54) ON-DIE SWITCHABLE TEST CIRCUIT

(75) Inventors: Larry W. Finn, Georgetown, TX (US); Leonard E. Mohrmann, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 370 days.

(21) Appl. No.: 10/187,726

(22) Filed: Jul. 2, 2002

(65) Prior Publication Data

US 2004/0004864 A1    Jan. 8, 2004

(51) Int. Cl.
    *G11C 7/00*    (2006.01)
(52) U.S. Cl. .................. 365/201; 365/148; 365/149
(58) Field of Classification Search ............ 365/201, 365/100, 226, 189.05; 327/208, 276; 714/719
    See application file for complete search history.

(56) References Cited

U.S. PATENT DOCUMENTS

| 5,467,040 | A | * | 11/1995 | Nelson et al. ............ 327/276 |
| 5,822,333 | A | * | 10/1998 | Foss ........................ 714/719 |
| 5,896,400 | A |   | 4/1999  | Roohparvar et al. ....... 371/22.1 |
| 5,901,103 | A | * | 5/1999  | Harris et al. ............. 365/226 |
| 6,028,443 | A |   | 2/2000  | Ozaki ...................... 326/16 |
| 6,166,563 | A |   | 12/2000 | Volk et al. ................ 326/87 |
| 6,178,128 | B1| * | 1/2001  | Morgan .................... 365/201 |
| 6,199,182 | B1|   | 3/2001  | Whetsel ................... 714/724 |
| 6,337,819 | B1|   | 1/2002  | Shinozaki ................. 365/201 |
| 6,737,899 | B1| * | 5/2004  | Sudjian .................... 327/208 |

FOREIGN PATENT DOCUMENTS

JP    10285012 A    10/1998

* cited by examiner

*Primary Examiner*—David Lam
(74) *Attorney, Agent, or Firm*—Baker Botts L.L.P.

(57) ABSTRACT

An information handling system includes a computer system having at least one integrated circuit formed on a die. The integrated circuit includes an output circuit and a device pin operably connected with the output circuit. A load resistor (or other type of load or termination component) and a test switch for selectively connecting the load resistor to the output circuit are also formed on the die. In one aspect, the load resistor is selected to correspond with a representative system load.

19 Claims, 1 Drawing Sheet

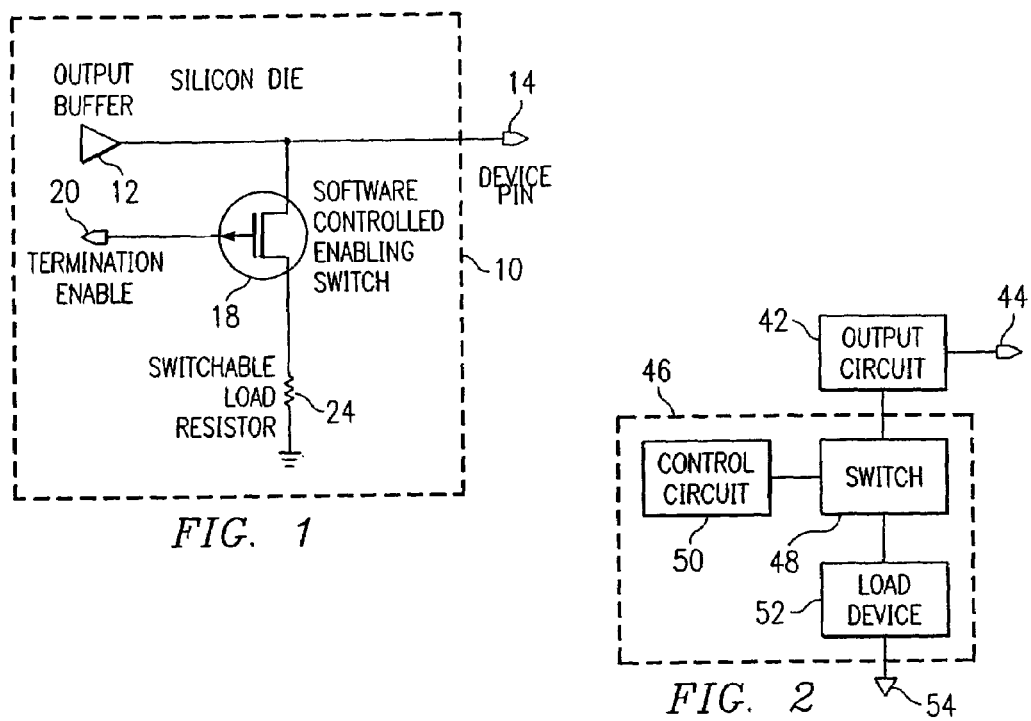
FIG. 1
FIG. 2
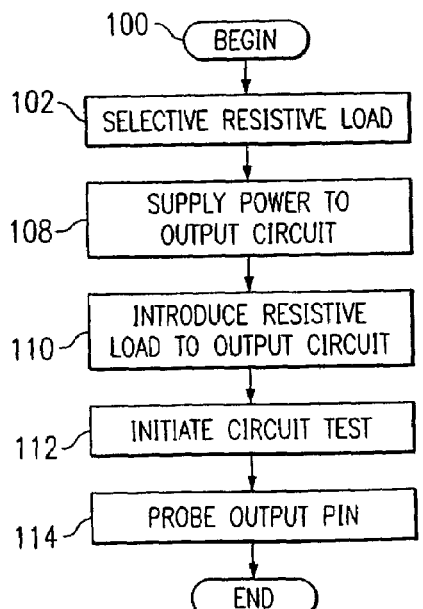
FIG. 3

ON-DIE SWITCHABLE TEST CIRCUIT

TECHNICAL FIELD

The following disclosure relates in general to electronic devices and in particular to an on-die output buffer test circuit.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store and communicate information and may include one or more computer systems, data storage systems, and networking systems.

Information handling systems typically include multiple system components. During the design of information handling systems, system components are characterized to properly allow system components to communicate. As system bus speeds increase, it is becoming more and more difficult to characterize components using external testing methods. In some cases, component characteristics such as input/output (I/O) buffer models are provided by component manufacturers that specify the test loads at which the data was obtained. However, this data is often produced via simulation and not correlated with physical data. Consequently, information handling system designers must choose between either trusting the models provided by the component manufacturers, or undertaking the cost of producing an appropriate test fixture and the difficult and time consuming task of testing the components in order to validate the I/O buffer models provided by the manufacturer.

Current methods for correlating device models or testing output buffers involve system simulation with vender supplied characteristic data of the devices and lab measurements for verification, connecting external components into the system design and lab measurements, or creating special case test boards where the components under test can be mounted. These methods are time consuming and can be very difficult, and ultimately may not produce accurate results.

SUMMARY

Therefore, a need has arisen for a system or method for providing information handling system components with accurate and reliable characteristic information.

A further need has arisen for a system or method of validating component characteristic models that does not require the time and expense of traditional component testing.

In accordance with teachings of the present disclosure, a system and method are described for an on-die switchable test circuit for information handling system components that reduces the problems associated with prior information handling system components.

In one aspect of the present disclosure, an information handling system is described that includes a computer system having at least one integrated circuit formed on a die. The integrated circuit includes an output circuit and a device pin operably connected with the output circuit. A load resistor and a test switch for selectively connecting the load resistor to the output circuit are also formed on the die. More particularly, the load resistor is selected to correspond with a representative system load.

In another aspect, the present disclosure describes a method of testing an integrated circuit for use in an information handling system. The method includes selecting a resistive load corresponding to a predicted system load. Power is then supplied to the output circuit. The load resistor is connected to the output circuitry of the integrated circuit and measured. In one aspect, the output circuit may be an output buffer.

The present disclosure includes a number of important technical advantages. One technical advantage is including a load resistor corresponding to a selected system load and a test switch. This aspect of the present disclosure facilitates component I/O characterization to validate component buffer models without the time and expense of traditional component testing. Such testing increases the accuracy and reliability of component characteristic information.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is a schematic diagram of a portion of a die in accordance with the present disclosure;

FIG. 2 is a schematic diagram of an output circuit and test circuit according to the present disclosure; and FIG. 3 is a flow diagram of method of testing an output circuit according to the present disclosure.

DETAILED DESCRIPTION

Preferred embodiments and their advantages are best understood by reference to FIGS. 1 through 3, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Now referring to FIG. 1, a schematic diagram of a portion of a die, depicted generally at 10, is shown. In the present preferred embodiment, die 10 may be a portion of a microprocessor or another component of an information handling system. Die 10 includes output buffer 12 connected to device pin 14. Device pin 14 is the external package pin of the device that connects output buffer 12 to the information handling system the device is integrated into. In some embodiments, integrated circuit die 10 may be disposed upon a chip carrier package. In the present embodiment, a wire or other suitable connector connects the die's buffer 12 to external device pin 14. Device pin 14 may be disposed such that it may be accessed by a common probe associated with an oscilloscope or other suitable type of test equipment.

In the present embodiment switch 18 may be activated by a signal resulting from a series of executable commands. More particularly, switch 18 may be a software controlled enabling switch. Switch 18 is operable to receive activation signals from termination enable 20. Termination enable 20 signal is generated to put the device into a test mode. This test mode may be for testing the buffers only, or be part of a larger test routine for the device. The termination enable signal 20 may be sourced from either executed commands internal to the device or an external test signal.

Switch 18 may operably connect switchable load resistor 24 with the output signal within the device package 10, thereby introducing the load resistance from resistor 24 to the output signal from output buffer 12. Resistor 24 is further connected to a load voltage rail. Preferably, load resistor 24 is formed to correspond with an anticipated system load. For example, the resistive load may be 60 ohms for a PCI bus output buffer.

Introducing the load resistance of load resistor 24 to output buffer 12 allows for simplified method of testing output buffer 12. Such testing may be used determine the output characteristics of output buffer 12 under the resistive load or load resistor 24. This testing may also be used to validate component characteristic models without the time and expense of traditional component testing. Switch 18 allows the resistive test load of load resistor 24 to be connected or disconnected via software. This, in turn, enables device probing at output pin 14 and requires no additional external test circuitry. Such testing increases the accuracy and reliability of component characteristic information.

Component characterization information obtained or verified by such testing may then be used in the design of information handling systems to ensure that the components within the system function appropriately. Additionally, this switchable test load may be used to verify the proper operation of output buffer 12.

FIG. 2 is a schematic diagram of an output circuit, depicted at 42 and a test circuit, depicted generally at 46, according to the present disclosure. Output circuit 42 is operatively connected to output pin 44. Output pin 44 may be accessed by a probe or other means to measure the output signal of output circuit 42. Output circuit 42 is connected with test circuit 46. In one embodiment, output circuit 42 may be a output buffer. In an alternative embodiment, output circuit 42 may be an output power rail.

Test circuit 46 includes switch 48, control circuit 50, and load device 52. Control circuit 50 is operable to activate switch 48. When activated, switch 48 may connect load device 52 with output circuit 42. Load device 52 may comprise a load resistor selected to provide a resistive load selected to correspond to a anticipated system load. Load device 52 is further connected to ground 54. In the present embodiment, output circuit 42 and test circuit 46 are preferably dispose on a die.

In an alternative embodiment, load device 52 may include a resistive load that is not purely resistive, such as an R-C circuit or a filter. In yet another alternative embodiment, the load device 52 and switch 48 may be present in a chip carrier package, thereby not being limited to being present only on the die.

FIG. 3 is a flow diagram of the test method of an output circuit according to the present disclosure. The method begins at 100 by selecting resistive load 102. This step typically requires selecting a resistive load corresponding to an anticipated system load. For instance, the resistive load may be 60 ohms for a PCI bus output. In an alternative embodiment, any anticipated system load that may be included on a die may be selected. In one embodiment, the switch may be controlled by a control circuit. In an alternative embodiment, the switch may be connected with a device pin and activated by initiating a signal to the switch via the pin.

A die is then provided with the selected resistive load formed thereon adjacent to an output circuit. The die also includes a switch for selectively applying the resistive load to the output circuit. Testing of the circuit occurs when power is supplied to the output circuit 108. During testing, the resistive load from the load resistor is introduced to the output from the output circuit 110. Further, during a test of the output circuit, the output circuit may be initiated to produce a pre-selected output 112. The output of the output circuit may then be measured by probing a device pin associated with the output circuit 114.

Although the disclosed embodiments have been described in detail, it should be understood that various changes, substitutions and alterations can be made to the embodiments without departing from their spirit and scope.

What is claimed is:

1. An information handling system comprising:
   a computer system having at least one integrated circuit formed on a die, the integrated circuit comprising:
   an output circuit comprising a PCI bus output buffer;
   a device pin operably connected with the output circuit, the device pin operable to be accessed by a test probe associated with an oscilloscope;
   a load resistor formed on the die;
   a test switch for selectively connecting the load resistor to the output circuit.

2. The information handling system of claim 1 wherein the load resistor comprises an approximately 60 ohm load resistor.

3. The information handling system of claim 1 wherein the load resistor further comprises a filter.

4. The information handling system of claim 1 further comprising:
   a test controller connected to the test switch and operable to generate a test control signal;
   the test switch operable to receive the test control signal and selectively connect the load resistor and the output circuit.

5. The information handling system of claim 4 wherein the test control signal comprises a termination enable signal that activates the test switch.

6. The information handling system of claim 1 where in the load resistor comprises an R-C circuit.

7. The information handling system of claim 1 further comprising the load resistor corresponding to a selected system load.

8. An apparatus formed on a die, the apparatus comprising:
   an output circuit comprising a PCI bus output buffer;
   a device pin operably connected with the output circuit, the device pin operable to be accessed by a test probe associated with an oscilloscope;
   a load resistor formed on the die;
   a test switch for selectively connecting the load resistor to the output circuit.

9. The apparatus of claim 8 further comprising the load resistor corresponding to a system load of a value selected by a device manufacturer to qualify a model performance.

10. The apparatus of claim 8 wherein the switch further comprises a software enabled switch.

11. The apparatus of claim 8 further comprising:
    a test controller connected to the test switch and operable to generate a test control signal;
    the test switch operable to receive the test control signal and selectively connect the load resistor and an output buffer.

12. The apparatus of claim 11 wherein the test control signal comprises a termination enable signal.

13. The apparatus of claim 8 wherein the load resister comprises an approximately 60 ohm load resister.

14. The apparatus of claim 8 wherein the load resistor comprises an R-C circuit.

15. The apparatus of claim 16 wherein the load resistor corresponds to a selected system load.

16. A method of testing an integrated circuit output circuit for use in an information handling system comprising:
    selecting a resistive load corresponding to a predicted system load;
    forming an output circuit on the die, the output circuit comprising a PCI bus output buffer;
    forming a load resistor on the die proximate the switch;
    supplying power to the output circuit;
    connecting the load resistor and the output circuitry; and
    measuring the output circuit response at a device pin operably connected with the output circuit, the device pin operable to be accessed by a test probe associated with an oscilloscope.

17. The method of claim 16 wherein the step of forming a load resistor comprises forming an approximately 60 ohm load resistor.

18. The method of claim 16 where the step of forming a load resistor comprises forming an R-C circuit.

19. The method of claim 16 wherein the step of forming a load resistor comprises forming a load resister corresponding to a selected system load.

* * * * *